(12) United States Patent
Sun et al.

(10) Patent No.: US 8,164,389 B2
(45) Date of Patent: Apr. 24, 2012

(54) OVERDRIVE PROTECTION CIRCUIT

(75) Inventors: Xiaopeng Sun, Fremont, CA (US);
Mehra Mokalla, San Jose, CA (US);
Wenlong Ma, Fremont, CA (US); Barry Jia-Fu Lin, Cupertino, CA (US)

(73) Assignee: TriQuint Semiconductor, Inc., Hillsboro, OR (US)

( * ) Notice: Subject to any disclaimer, the term of this patent is extended or adjusted under 35 U.S.C. 154(b) by 71 days.

(21) Appl. No.: 12/788,267

(22) Filed: May 26, 2010

(65) Prior Publication Data

US 2011/0291765 A1 Dec. 1, 2011

(51) Int. Cl.
*H02H 7/20* (2006.01)
(52) U.S. Cl. ...................................... 330/298; 330/207 P
(58) Field of Classification Search .................. 330/298, 330/207 P
See application file for complete search history.

(56) References Cited

U.S. PATENT DOCUMENTS

| | | | | | |
|---|---|---|---|---|---|
| 3,526,846 A | * | 9/1970 | Campbell | ...................... | 330/298 |
| 3,974,438 A | * | 8/1976 | Alves, III | ........................... | 330/2 |
| 4,114,108 A | | 9/1978 | Faulkenberry | | |
| 4,737,733 A | * | 4/1988 | LaPrade | ........................ | 330/277 |
| 4,751,473 A | * | 6/1988 | Ono | ............................... | 330/277 |
| 4,860,154 A | * | 8/1989 | Fazlollahi | ...................... | 361/101 |
| 5,834,978 A | * | 11/1998 | Cho | ............................... | 330/298 |
| 6,850,119 B2 | * | 2/2005 | Arnott | ............................ | 330/298 |
| 7,486,144 B2 | | 2/2009 | Mitzlaff | | |

OTHER PUBLICATIONS

Kim, Min-Gun, et al., "An FET-Level Linearization Method Using a Predistortion Branch FET," IEEE Microwave and Guided Wave Letters, vol. 9, No. 6, pp. 233-235, Jun. 1999.

Lee, C.P., et al., "Averaging and Cancellation Effect on High-Order Nonlinearity of a Power Amplifier," IEEE Transactions on Circuits and Systems—I: Regular Papers, vol. 54, No. 12, pp. 2733-2739, Dec. 2007.

\* cited by examiner

*Primary Examiner* — Patricia Nguyen
(74) *Attorney, Agent, or Firm* — Schwabe Williamson & Wyatt

(57) ABSTRACT

Embodiments of circuits, apparatuses, and systems for an overdrive protection circuit arranged at an input to a primary power transistor to protect against overdrive conditions, where the overdrive protection circuit includes a sensing resistor. Other embodiments may be described and claimed.

22 Claims, 4 Drawing Sheets

OVERDRIVE PROTECTION CIRCUIT

FIELD

Embodiments of the present disclosure relate generally to the field of circuits, and more particularly to an overdrive protection circuit.

BACKGROUND

Semiconductor devices used in radio frequency (RF) power amplifiers are limited by the power dissipation and voltage levels they can handle. RF power amplifiers can subject the transistors used therein to voltages and power levels that could cause failures under overdrive conditions. The transistor terminals that are subject to the most power stress are the output terminals. These are typically the collector in heterojunction bipolar transistor (HBT) processes and the drain in field-effect transistor (FET) processes, in common emitter and common source configurations, respectively. The failure mechanism is dominated by the breakdown of the collector-base junction or the drain-gate junction.

Improving the process to handle a greater breakdown margin is often difficult and may have tradeoffs that may not be desirable. To facilitate improvement of the breakdown issue, the problem may be addressed from a circuit point of view by circuits that detect and protect the main transistor or transistors of the power amplifier under overdrive conditions. In the past, most overdrive protection circuits were built based on the detection of output power or output current level, to control power supplies. This is complicated when implemented on a single chip.

The description in this section is related art, and does not necessarily include information disclosed under 37 C.F.R. 1.97 and 37 C.F.R. 1.98. Unless specifically denoted as prior art, it is not admitted that any description of related art is prior art.

BRIEF DESCRIPTION OF THE DRAWINGS

Embodiments are illustrated by way of example and not by way of limitation in the figures of the accompanying drawings, in which like references indicate similar elements and in which.

DETAILED DESCRIPTION

Various aspects of the illustrative embodiments will be described using terms commonly employed by those skilled in the art to convey the substance of their work to others skilled in the art. However, it will be apparent to those skilled in the art that alternate embodiments may be practiced with only some of the described aspects. For purposes of explanation, specific devices and configurations are set forth in order to provide a thorough understanding of the illustrative embodiments. However, it will be apparent to one skilled in the art that alternate embodiments may be practiced without the specific details. In other instances, well-known features are omitted or simplified in order not to obscure the illustrative embodiments.

Further, various operations will be described as multiple discrete operations, in turn, in a manner that is most helpful in understanding the present disclosure; however, the order of description should not be construed as to imply that these operations are necessarily order dependent. In particular, these operations need not be performed in the order of presentation.

The phrase "in one embodiment" is used repeatedly. The phrase generally does not refer to the same embodiment; however, it may. The terms "comprising," "having," and "including" are synonymous, unless the context dictates otherwise.

In providing some clarifying context to language that may be used in connection with various embodiments, the phrases "A/B" and "A and/or B" mean (A), (B), or (A and B); and the phrase "A, B, and/or C" means (A), (B), (C), (A and B), (A and C), (B and C) or (A, B and C).

The term "coupled with," along with its derivatives, may be used herein. "Coupled" may mean one or more of the following. "Coupled" may mean that two or more elements are in direct physical or electrical contact. However, "coupled" may also mean that two or more elements indirectly contact each other, but yet still cooperate or interact with each other, and may mean that one or more other elements are coupled or connected between the elements that are said to be coupled with each other.

Figure 1:
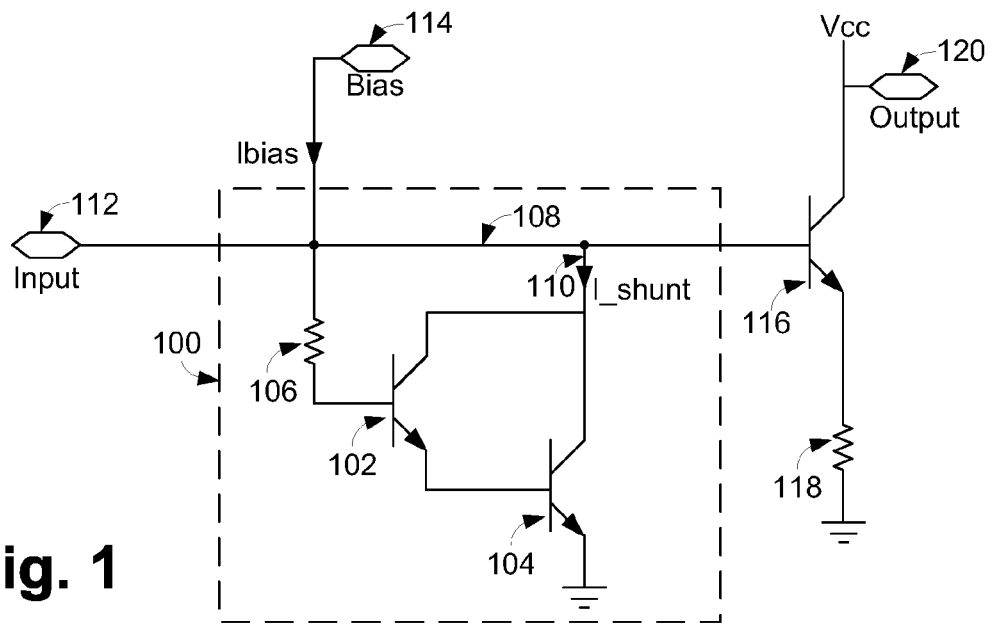
FIG. 1 is a schematic of an overdrive protection circuit, in accordance with various embodiments of the present disclosure.

FIG. 1 illustrates an overdrive protection circuit 100 in accordance with various embodiments of the present disclosure. The overdrive protection circuit 100 includes two transistors 102, 104, and a sensing resistor 106. As may be seen in FIG. 1, the two transistors 102, 104 are arranged in a Darlington configuration. The overdrive protection circuit 100 is coupled with a radio frequency (RF) transmission line 108 via the sensing resistor 106 and a shunt line 110. The RF transmission line 108 is coupled with an RF signal input source 112 that generates an RF signal, and is also coupled with a current source 114 that provides a base bias current Ibias. The RF signal input source 112 may be included within a transceiver. The RF transmission line 108 is coupled with a base of a primary power transistor 116 that serves as a power amplifier for the RF signal. The primary power transistor 116 is coupled with ground via a resistor 118 at its emitter, while its collector is coupled with an output node 120 and a collector supply bias Vcc that provides current Icc.

It is generally desirable for the coupling of the overdrive protection circuit 100 with the primary power transistor 116 to add as little parasitic effect to the overall circuit as possible. This may be facilitated by sizing the sensing resistor 106 in a manner such that an impedance provided by the overdrive protection circuit 100 is much larger than an impedance at the input of the primary power transistor 116. In general, in the embodiment of FIG. 1, the added impedance of the overdrive protection circuit 100 may generally be 8 to 20 times larger than the impedance at the input of primary power transistor 116, so that performance of primary power transistor 116 is not impacted. Practical values for the sensing resistor 106 can be, for example, in a range of 1 ohm to 100,000 ohms. The size of the sensing resistor 106 may also affect the turn-on power level, i.e., the power level at which the overdrive condition is detected and the overdrive protection circuit 100 turns on.

Limiting the parasitic effect of the overdrive protection circuit 100 may be further facilitated by the sizing and arrangement of the transistors 102, 104. As previously mentioned, the transistors 102, 104 are arranged in a Darlington configuration. When transistor 102 is equal in size to transistor 104, the Darlington configuration may reduce by half the effective added emitter-base capacitance of the transistors 102, 104, since the overdrive protection circuit 100 will have two emitter-base junction capacitances that are equal and arranged in series. The transistor 102 does not need to be equal to the transistor 104 in size, and further reduction in emitter-base capacitance may be achieved if desired by making transistor 102 smaller than transistor 104.

Most of the capacitance added by the overdrive protection circuit 100 may be provided by the collector-to-emitter capacitance of the transistor 104. Given that the transistors 102, 104 may only need to shunt a fraction of the RF input power and bias current that is handled by the primary power transistor 116, the collective area of the transistors 102, 104 may be smaller than the area of the primary power transistor 116, with respect to the chip space. Thus, the collector-to-emitter capacitance of the transistor 104 may be much smaller than the base-to-emitter capacitance of the primary power transistor 116. As an example, practical sizes for transistors 102, 104 are generally 3 to 100 times smaller than the primary power transistor 116.

These impedance and capacitance characteristics of the overdrive protection circuit 100 work to limit the parasitic effect of the overdrive protection circuit 100. Under normal operating conditions, the overdrive protection circuit 100 may be substantially transparent, and the primary power transistor 116 may not generally degrade in performance. Under overdrive conditions, the overdrive protection circuit 100 turns on, shunting the bias current Ibias and input RF signal away from the primary power transistor 116, shown as I_shunt, via the shunt line 110. By shunting the input under overdrive conditions, the output power dissipation and peak collector voltage are significantly reduced, and the primary power transistor 116 is protected from breakdown and failure due to excessive power dissipation.

Figure 2:
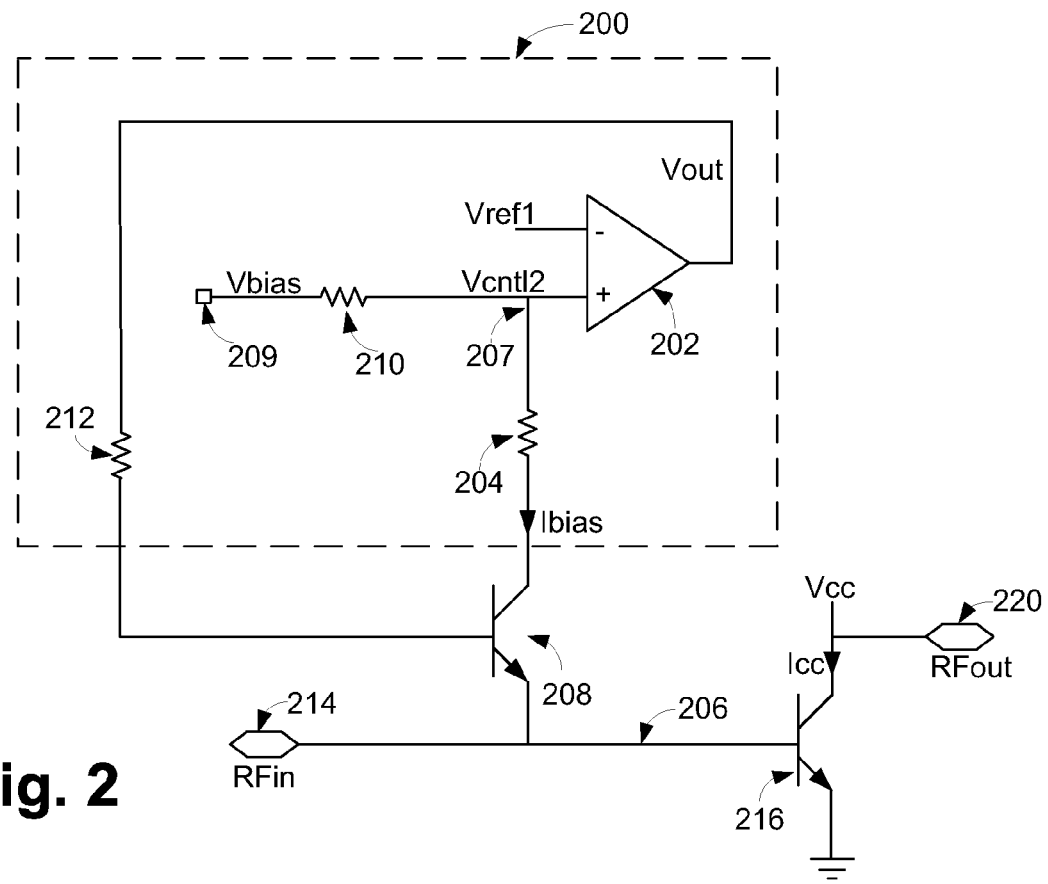
FIG. 2 is a schematic of another overdrive protection circuit, in accordance with various embodiments of the present disclosure.

FIG. 2 illustrates another overdrive protection circuit 200, in accordance with various embodiments of the present disclosure. The overdrive protection circuit 200 includes an operational amplifier 202 and a sensing resistor 204. The sensing resistor 204 is coupled with an RF transmission line 206 via a transistor 208, which serves as an emitter follower. The sensing resistor 204 is coupled with the operational amplifier 202 at the control voltage node 207, which is coupled via a resistor 210 with a bias voltage source 209 that provides a bias voltage Vbias. The output, Vout, of the operational amplifier 202 is coupled, via a resistor 212, with the base of the transistor 208. The RF transmission line 206 is coupled with an RF signal input source 214 that generates an RF signal, and to the base of a primary power transistor 216 that serves as a power amplifier. The RF signal input source 214 may be included within a transceiver. The primary power transistor 216 is coupled with ground at its emitter node, and the collector of the primary power transistor 216 is coupled with an output node 220 and a collector supply bias Vcc that provides current Icc.

The overdrive protection circuit 200 of FIG. 2 operates by setting the reference voltage Vref1 of the operational amplifier 202 to the control voltage Vcntl2 of the operational amplifier 202, whose value is determined by the maximum base bias current Ibias that flows through the sensing resistor 204 and turns off the base current of the transistor 208. As a result, the base bias current Ibias supplied to the primary transistor 216 will be shut off under extreme cases of input overdrive, when the sensing resistor 204 senses an extremely high bias current Ibias flowing through it. As a result, the primary power transistor 216 is protected from overdrive conditions. The overdrive protection circuit 200 of FIG. 2 may be implemented on a chip that includes the primary power transistor 216.

Exemplary sizes for the transistor 208 are 3 to 100 times smaller than the size of primary power transistor 216. Exemplary values for the reference resistor 212 are 100 to 100,000 ohms. The resistor 210 and the sensing resistor 204 are generally selected such that their ratio maintains a control voltage Vcntl2 that is more than reference voltage Vref1 during normal operation of the overdrive protection circuit 200.

In accordance with various embodiments of the present disclosure, the control voltage Vcntl2 and biasing current Ibias may be governed by the following equations:

$$Vcntl2 = Ibias \times Rsense + Vce + Vbe; \text{ and} \quad 1\text{-}1$$

$$Ibias = Icc/Beta; \quad 1\text{-}2$$

where Icc is the targeted maximum operating current of primary power transistor 216; Beta is the DC current gain of transistor 216; Rsense is a value of sensing resistor 204 and can be 1 ohm to approximately 10,000 ohms depending on targeted Icc; and Vce+Vbe may be approximately equal to 1.5V for HBT, where Vce is the voltage across the collector-emitter of transistor 208, and Vbe is the voltage across the base-emitter of primary power transistor 216.

The passive component R_210 of resistor 210 can be determined by $$R\_210 = (Vbias - Vcntl2)/Ibias \quad 2\text{-}1$$

The reference voltage Vref1 is the same as the control voltage Vcntl2, by definition of an operation amplifier, i.e., Vref1=Vcntl2. Passive component R_212 of resistor 212 can be determined based on the quiescent current Icq of power transistor 216, by the following two equations:

$$Iref2 = (Beta\_216 * Beta\_208)/Icq; \text{ and} \quad 3\text{-}1$$

$$R\_212 = (Vout - 2*Vbe)/Iref2; \quad 3\text{-}2$$

where Iref2 is the current through resistor 212; Beta_208 is DC current gain through transistor 208 under large signal, and Beta_216 is DC current gain through transistor 216 under large signal.

Figure 3:
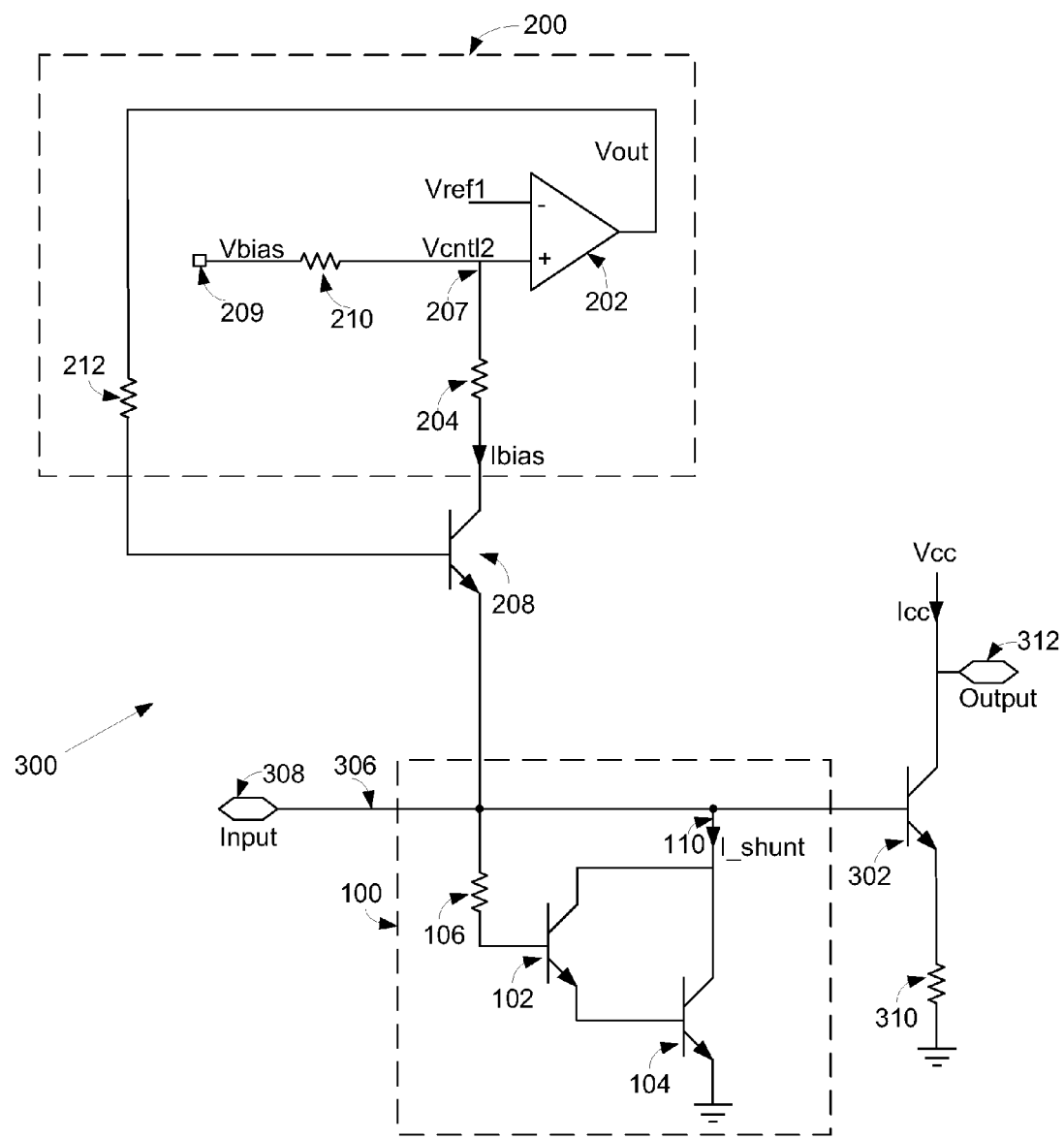
FIG. 3 is a schematic of an overdrive protection circuit that combines the overdrive protection circuits in FIGS. 1 and 2, in accordance with various embodiments of the present disclosure.

FIG. 3 illustrates the overdrive protection circuits 100, 200 of FIGS. 1 and 2 in an arrangement resulting in overdrive protection circuit 300 where both overdrive protection circuits 100, 200 are used to protect the primary power transistor 302 that serves as a power amplifier. Like reference numerals in FIG. 3 represent like elements from FIGS. 1 and 2. As may be seen, both overdrive protection circuits 100, 200 are coupled with an RF signal transmission line 306, which extends between RF input source 308 that generates an RF signal and the base of the primary power transistor 302. The RF signal input source 308 may be included within a transceiver. The primary power transistor 302 is coupled with ground via a resistor 310 at its emitter, while its collector is coupled with an output node 312 and to a collector supply bias Vcc that provides current Icc. Since overdrive protection circuits 100, 200 each have their own overdrive protection range, the overall protection range may be further extended by combining the two overdrive protection circuits 100, 200.

By carefully selecting the values of the sensing resistors 106, 204 for each overdrive protection circuit 100, 200, one of the overdrive protection circuits can be activated when the other overdrive protection circuit reaches the limit of its protection range.

Accordingly, embodiments of the present invention provide several approaches that protect power amplifiers from overdrive conditions, while being transparent under normal drive conditions. The circuit arrangements disclosed herein may be implemented on a chip that includes the RF signal input and the power amplifier. The added cost based upon area used on the chip is generally small, and therefore, the benefits of adding an overdrive protection circuit in accordance with the present disclosure generally outweighs any cost impacts. Additionally, the combination of the two overdrive protection circuits 100, 200, as illustrated and described in overdrive protection circuit 300 of FIG. 3, presents a dynamically changing biasing circuit whose power added efficiency at saturation is improved significantly without sacrificing linearity.

Figure 4:
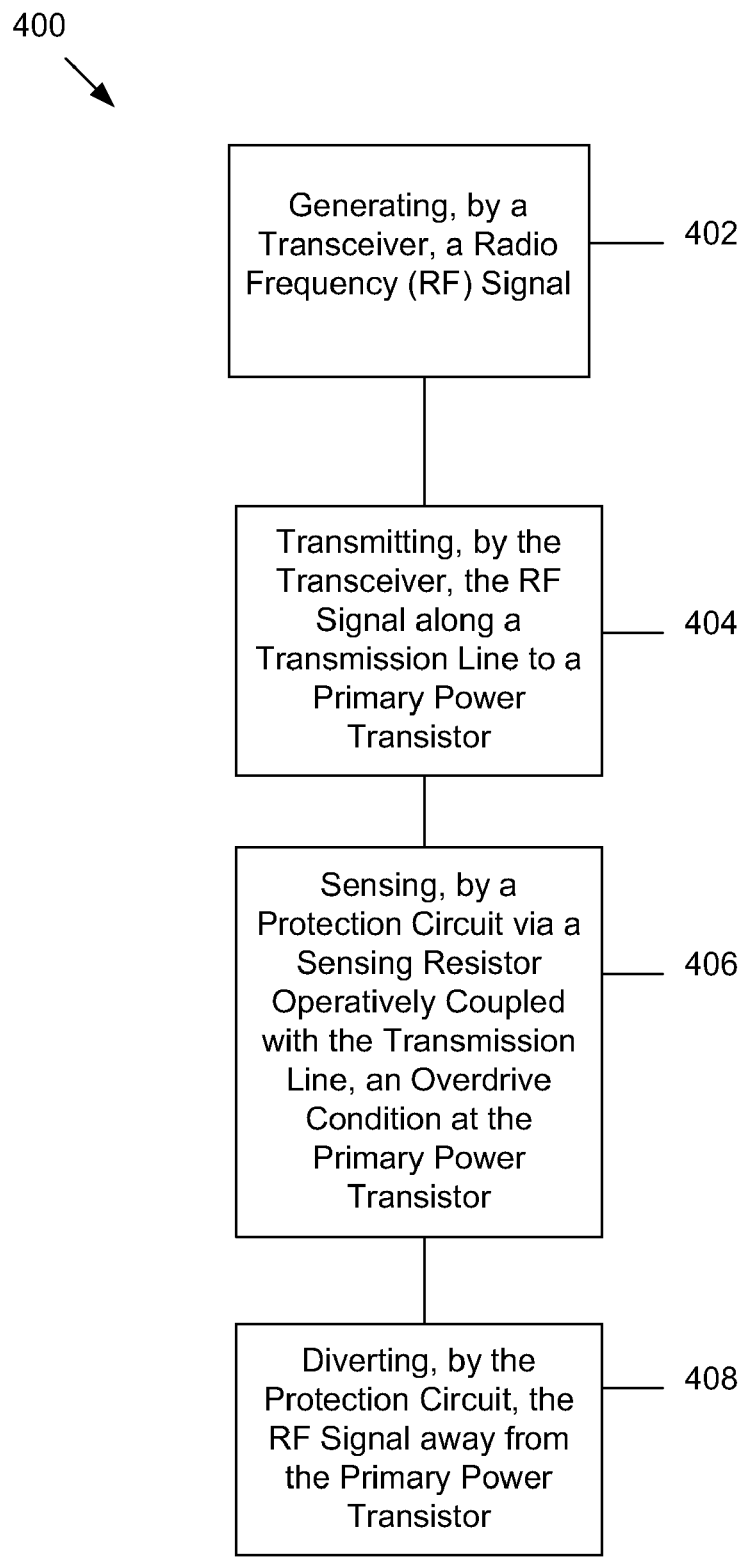
FIG. 4 is a flowchart illustrating various steps of a method, in accordance with various embodiments of the present disclosure.

FIG. 4 illustrates an exemplary method 400 of operation of the overdrive protection circuits 100, 200 and/or 300, in accordance with various embodiments. At 402, an RF signal is generated by a transceiver. At 404, the RF signal is transmitted, by the transceiver, along a transmission line to a primary power transistor. At 406, an overdrive condition is sensed by a protection circuit via a sensing resistor operatively coupled with the transmission line. At 408, the RF signal is diverted away from the primary power transistor by the protection circuit. In accordance with various embodiments, the diverting is achieved by shunting the RF signal. In accordance with various embodiments, the diverting is achieved by turning off a base bias current of the primary power transistor.

While the present invention has been described with reference to HBT technology, those skilled in the art will understand that other bipolar technologies such as, for example, bipolar junction transistor (BJT), FET, and BiCMOS (combination of BJT and complementary-metal-oxide-semiconductor) technologies would also benefit from overdrive protection circuits as described herein.

Figure 5:
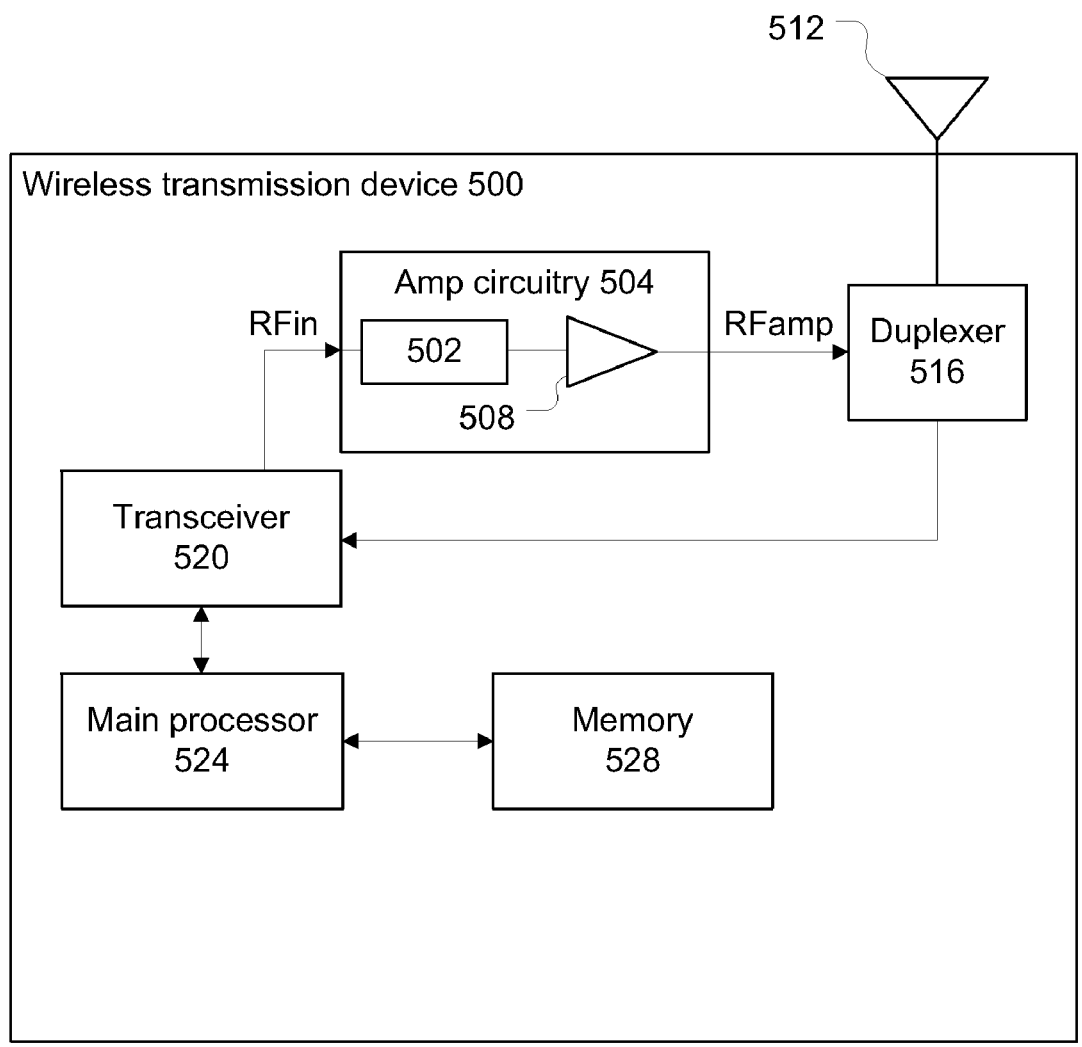
FIG. 5 illustrates a wireless transmission device implementing an overdrive protection circuit, in accordance with at least some embodiments of the present disclosure.

The overdrive protection circuits 100, 200 and 300 may be incorporated into any of a variety of apparatuses and systems. A block diagram of an exemplary wireless transmission device 500 incorporating one of the overdrive protection circuits 100, 200 and 300 (represented by 502) into amplification circuitry 504 that includes a power amplifier 508 is illustrated in FIG. 5. In addition to the amplification circuitry 504, the wireless transmission device 500 may have an antenna structure 512, a duplexer 516, a transceiver 520, a main processor 524, and a memory 528 coupled with each other at least as shown. While the wireless transmission device 500 is shown with transmitting and receiving capabilities, other embodiments may include wireless transmission devices without receiving capabilities.

In various embodiments, the wireless transmission device 500 may be, but is not limited to, a mobile telephone, a paging device, a personal digital assistant, a text-messaging device, a portable computer, a desktop computer, a telecommunications base station, a subscriber station, an access point, a radar, a satellite communication device, or any other device capable of wirelessly transmitting RF signals.

The main processor 524 may execute a basic operating system program, stored in the memory 528, in order to control the overall operation of the wireless transmission device 500. For example, the main processor 524 may control the reception of signals and the transmission of signals by transceiver 520. The main processor 524 may be capable of executing other processes and programs resident in the memory 528 and may move data into or out of memory 528, as desired by an executing process.

The transceiver 520 may receive outgoing data (e.g., voice data, web data, e-mail, signaling data, etc.) from the main processor 524, may generate the RFin signal to represent the outgoing data, and provide the RFin signal to the amplification circuitry 504.

The amplification circuitry 504 may amplify the RFin signal in accordance with a selected amplification mode. The amplified RFamp signal may be forwarded to the duplexer 516 and then to the antenna structure 512 for an over-the-air (OTA) transmission.

In a similar manner, the transceiver 520 may receive an incoming OTA signal from the antenna structure 512 through the duplexer 516. The transceiver 520 may process and send the incoming signal to the main processor 524 for further processing.

In various embodiments, the antenna structure 512 may include one or more directional and/or omnidirectional antennas, including, e.g., a dipole antenna, a monopole antenna, a patch antenna, a loop antenna, a microstrip antenna or any other type of antenna suitable for OTA transmission/reception of RF signals.

Those skilled in the art will recognize that the wireless transmission device 500 is given by way of example and that, for simplicity and clarity, only so much of the construction and operation of the wireless transmission device 500 as is necessary for an understanding of the embodiments is shown and described. Various embodiments contemplate any suitable component or combination of components performing any suitable tasks in association with wireless transmission device 500, according to particular needs. Moreover, it is understood that the wireless transmission device 500 should not be construed to limit the types of devices in which embodiments may be implemented.

Although the present disclosure has been described in terms of the above-illustrated embodiments, it will be appreciated by those of ordinary skill in the art that a wide variety of alternate and/or equivalent implementations calculated to achieve the same purposes may be substituted for the specific embodiments shown and described without departing from the scope of the present disclosure. Those with skill in the art will readily appreciate that the teachings of the present disclosure may be implemented in a wide variety of embodiments. This description is intended to be regarded as illustrative instead of restrictive.

What is claimed is:

1. A circuit arrangement comprising:
    a protection circuit comprising a sensing resistor;
    a transmission line configured to transmit a radio frequency (RF) signal, wherein the protection circuit is coupled with the transmission line via the sensing resistor; and
    a primary power transistor that serves as a power amplifier for the RF signal;
    wherein the protection circuit is coupled with a base of the primary power transistor via the transmission line and the protection circuit further comprises two transistors coupled with the sensing resistor and coupled with the transmission line via a shunt line.

2. The circuit arrangement of claim 1, wherein the two transistors are arranged in a Darlington configuration.

3. A circuit arrangement comprising:
a protection circuit comprising a sensing resistor;
a transmission line configured to transmit a radio frequency (RF) signal, wherein the protection circuit is coupled with the transmission line via the sensing resistor; and
a primary power transistor that serves as a power amplifier for the RF signal;
wherein the protection circuit is coupled with a base of the primary power transistor via the transmission line and is coupled with the transmission line via an emitter follower;
wherein the protection circuit further comprises an operational amplifier;
wherein the sensing resistor is coupled with a voltage control node of the operational amplifier and is coupled with the transmission line via a collector of the emitter follower; and
wherein an output of the operational amplifier is coupled with a base of the emitter follower.

4. The circuit arrangement of claim 3, wherein the protection circuit comprises a first protection circuit and the sensing resistor comprises a first sensing resistor, the circuit arrangement further comprising:
a second protection circuit coupled with the base of the primary power transistor via the transmission line;
wherein the second protection circuit comprises a second sensing resistor that is coupled with the transmission line.

5. The circuit arrangement of claim 4, wherein the second protection circuit further comprises two transistors coupled with the second sensing resistor and coupled with the transmission line via a shunt line.

6. The circuit arrangement of claim 5, wherein the two transistors are arranged in a Darlington configuration.

7. A system comprising:
a transceiver configured to provide a radio frequency (RF) signal;
amplification circuitry coupled with the transceiver, the amplification circuitry including a primary power transistor configured to receive and amplify the RF signal;
a transmission line configured to transmit the RF signal from the transceiver to a base of the primary power transistor; and
an overdrive protection circuit, the overdrive protection circuit comprising:
a sensing resistor that is coupled with the transmission line; and
two transistors coupled with the sensing resistor and coupled with the transmission line via a shunt.

8. The system of claim 7, wherein the two transistors are arranged in a Darlington configuration.

9. A system comprising:
a transceiver configured to provide a radio frequency (RF) signal;
amplification circuitry coupled with the transceiver, the amplification circuitry including
a primary power transistor configured to receive and amplify the RF signal;
a transmission line configured to transmit the RF signal from the transceiver to a base of the primary power transistor; and
an overdrive protection circuit, the overdrive protection circuit comprising a sensing resistor that is coupled with the transmission line,
wherein the overdrive protection circuit is coupled with the transmission line via an emitter follower;
wherein the overdrive protection circuit further comprises an operational amplifier;
wherein the sensing resistor is coupled with a voltage control node of the operational amplifier and is coupled with the transmission line via a collector of the emitter follower; and
wherein an output of the operational amplifier is coupled with a base of the emitter follower.

10. The system of claim 9, wherein the overdrive protection circuit comprises a first overdrive protection circuit and the sensing resistor comprises a first sensing resistor, the system further comprising:
a second overdrive protection circuit coupled with the base of the primary power transistor along the transmission line;
wherein the second overdrive protection circuit comprises a second sensing resistor that is coupled with the transmission line.

11. The system of claim 10, wherein the second overdrive protection circuit further comprises two transistors coupled with the second sensing resistor and coupled with the transmission line via a shunt line.

12. The system of claim 11, wherein the two transistors are arranged in a Darlington configuration.

13. A method comprising:
generating, by a transceiver, a radio frequency (RF) signal;
transmitting, by the transceiver, the RF signal along a transmission line coupled with a gate of a primary power transistor;
sensing, by a protection circuit via a sensing resistor coupled with the transmission line, an overdrive condition at the primary power transistor; and
shunting, by a transistor of the protection circuit, at least a portion of the RF signal based on said sensing of the overdrive condition.

14. The method of claim 13, further comprising:
reducing, by another protection circuit, a base biasing current of the primary power transistor.

15. A method comprising:
generating, by a transceiver, a radio frequency (RF) signal;
transmitting, by the transceiver, the RF signal along a transmission line to a primary power transistor;
sensing, by a protection circuit via a sensing resistor coupled with the transmission line, an overdrive condition at the primary power transistor;
diverting, by the protection circuit, at least a portion of the RF signal away from the primary power transistor; and
sensing when the protection circuit has reached a protection threshold and turning on another protection circuit when the protection threshold is reached, wherein said diverting is performed by one of either the protection circuit or the another protection circuit.

16. The method of claim 15, wherein said diverting comprises shunting the RF signal via the protection circuit.

17. The method of claim 15, wherein said diverting comprises turning off a base biasing current of the primary power transistor.

18. The method of claim 14, further comprising sensing when the protection circuit has reached a protection threshold and reducing, by the other protection circuit, the base biasing current when the protection threshold is reached.

19. The method of claim 14, wherein said reducing comprises turning off the base biasing current of the primary power transistor.

20. The method of claim 13, wherein the primary power transistor and the protection circuit are implemented on a single chip.

21. The circuit arrangement of claim 1, wherein the protection circuit and the primary power transistor are implemented on a single chip.

22. The circuit arrangement of claim 3, wherein the protection circuit and the primary power transistor are implemented on a single chip.

* * * * *